United States Patent [19]

Tsuji et al.

[11] Patent Number: 5,403,776
[45] Date of Patent: Apr. 4, 1995

[54] PROCESS OF USING A JIG TO ALIGN AND MOUNT TERMINAL CONDUCTORS TO A SEMICONDUCTOR PLASTIC PACKAGE

[75] Inventors: Kazuto Tsuji; Tetsuya Hiraoka, both of Kawasaki; Tsuyoshi Aoki, Sagamihara; Junichi Kasai, Kawasaki, all of Japan

[73] Assignee: Fujitsu Limited, Kawaski, Japan

[21] Appl. No.: 152,239

[22] Filed: Nov. 16, 1993

Related U.S. Application Data

[60] Division of Ser. No. 53,802, Apr. 29, 1993, Pat. No. 5,293,072, which is a continuation of Ser. No. 720,209, Jun. 24, 1991, abandoned.

[30] Foreign Application Priority Data

Jun. 25, 1990 [JP] Japan ................... 2-165979

[51] Int. Cl.6 .................... H01L 21/28; H01L 21/56; H01L 21/58; H01L 21/60
[52] U.S. Cl. ..................... 437/183; 437/217; 257/738; 257/780; 228/180.22
[58] Field of Search ............... 437/183, 217; 257/738, 257/780; 228/180.22

[56] References Cited

U.S. PATENT DOCUMENTS

| | | | |
|---|---|---|---|
| 3,959,874 | 6/1976 | Coucoulas | 29/577 |
| 4,530,152 | 7/1985 | Roche et al. | 437/211 |
| 4,994,902 | 2/1991 | Okahashi et al. | 357/80 |

FOREIGN PATENT DOCUMENTS

| | | | |
|---|---|---|---|
| 0082902 | 7/1983 | European Pat. Off. | |
| 0263222 | 4/1988 | European Pat. Off. | |
| 242908 | 2/1987 | Germany | 437/183 |
| 55-74147 | 6/1980 | Japan | 228/180.22 |
| 60-154536 | 8/1985 | Japan | 437/183 |
| 62-25435 | 2/1987 | Japan | 437/183 |
| 62-266857 | 11/1987 | Japan | 257/738 |
| 1129446 | 5/1989 | Japan | 437/183 |
| 88/06395 | 8/1988 | WIPO | |

OTHER PUBLICATIONS

E. Stephens, "Pinless Module Connector," *IBM Technical Disclosure Bulletin,* vol. 20, No. 10, Mar. 1978, p. 3872.

J. Lyman, "Solder Columns Secure Chip Carriers to Epoxy," *Electronics,* vol. 58, No. 37, Sep. 16, 1985, pp. 20–21.

*Primary Examiner*—Olik Chaudhuri
*Assistant Examiner*—David E. Graybill

[57] ABSTRACT

A process of manufacturing semiconductor device accommodated in a package including a semiconductor chip, a package body for accommodating the semiconductor chip, and a plurality of terminal members embedded in the package body in electrical connection to the semiconductor chip and projecting from a bottom surface of the package body, wherein each of said terminal members is of spherical form, such that the terminal members roll substantially freely when placed on a flat surface, and of a substantially identical diameter.

6 Claims, 6 Drawing Sheets

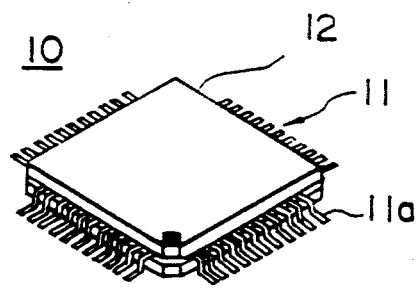
FIG. 1
(PRIOR ART)
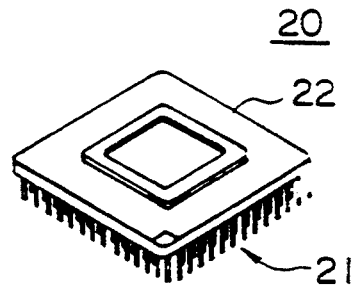
FIG. 2
(PRIOR ART)
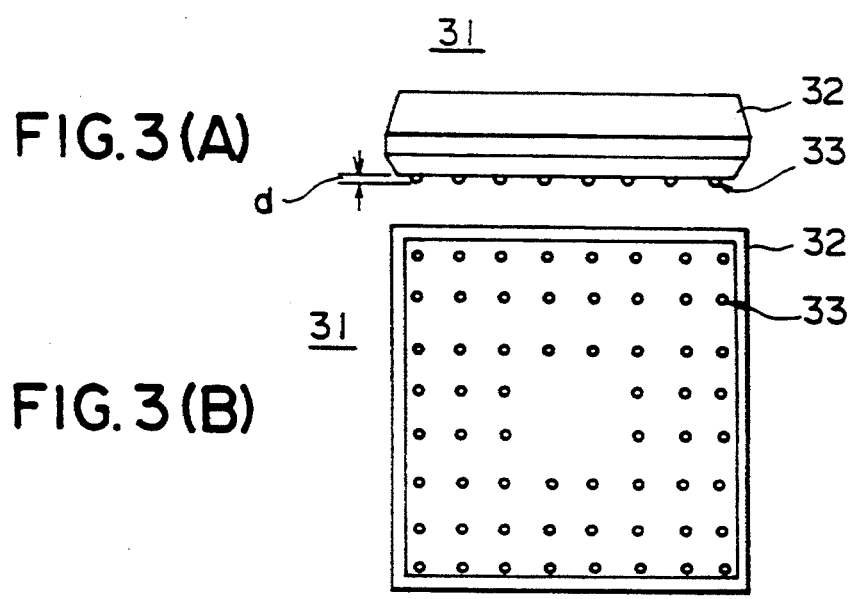
FIG. 3(A)
FIG. 3(B)

PROCESS OF USING A JIG TO ALIGN AND MOUNT TERMINAL CONDUCTORS TO A SEMICONDUCTOR PLASTIC PACKAGE

This application is a division of application Ser. No. 08/053,802, filed Apr. 29, 1993, now U.S. Pat. No. 5,293,072, which is a continuation of application Ser. No. 07/720,209, filed Jun. 24, 1991, now abandoned.

BACKGROUND OF THE INVENTION

The present invention generally relates to packaging of semiconductor devices, and more particularly to a packaged semiconductor device that can be produced at a reduced cost.

With the progress of fabrication processes of semiconductor devices, the integration density of integrated circuits formed on a semiconductor chip is increasing continuously. With the increase in the integration density, the packages used for accommodating the semiconductor chip also are required to have a capability of providing a large number of interconnections leads in correspondence to the increased number of terminals on the chip.

FIG. 1 shows a conventional package 10 of the so-called QFP (quad flat package) type wherein a number of leads 11 are provided along the side of a package body 12. The leads 11 project laterally in the outward direction from the package body 12 and are bent downwardly. Further, the leads 11 are bent again in the horizontal direction and form the terminals 11a that extend laterally from the body 12. Thereby, a so-called gull-wing type terminal is formed. Obviously, this type of package, having the leads along the side wall of the package body, has a problem of insufficient location for providing the interconnection leads and is not suitable for accommodating semiconductor devices having a large integration density. Further, this type of package tends to exhibit variations in the vertical levels of the terminal parts 11a of the leads 11. Generally, the level of the terminal 11a may change as much as 100 μm. However, such a large variation in the level of the terminal is not desirable from the view point of enabling reliable interconnections.

In order to avoid the problem pertinent to the package of FIG. 1, a so-called PGA (pin grid array) package is proposed as shown in FIG. 2, wherein a large number of interconnection pins 21 are arranged in rows and columns on the bottom surface of a package body 22. Thereby, one can increase the number of leads on the package body 22 dramatically. For example, leads of as many as several tens in number can be provided without difficulty. This PGA package, on the other hand, has a problem in that a process for embedding the pins 21 in the package body 22 is necessary. Generally, this process includes processes of introducing a large number of minute metal rods on a package body, and than to shake the body until the metal rods are settled in the holes formed thereby in the package body, as the pins 21. After the pins are settled, it is necessary to fix the pins on the package body 22. Thus, the process for fabricating the PGA package is time consuming and increases the cost of the device.

SUMMARY OF THE INVENTION

Accordingly, it is a general object of the present invention to provide a novel and useful semiconductor package wherein the foregoing problems are eliminated.

Another object of the present invention is to provide a packaged semiconductor device and a manufacturing method therefore, wherein the cost for manufacturing the device is reduced.

Another object of the present invention is to provide a semiconductor device package and a manufacturing method thereof, wherein metal spheres are arranged in a row and column formation on a bottom surface of the package body as interconnection leads. According to the present invention, the arrangement of the spheres in the row and column formation is achieved easily by using a jig that has a number of depressions arranged in correspondence to the row and column pattern of the interconnection leads. By applying a suction through the depressions, one can hold the spheres on the jig stably, and the spheres are connected mechanically as well as electrically to a lead frame either by welding or other processes, such as passing same through an annealing furnace. Thereby, one can easily arrange the spheres in the desired pattern such as the row and column formation, and the cost for manufacturing the device is decreased significantly. Further, by forming the depressions with a uniform diameter, one can set the amount of projection of the spheres from the bottom surface of the package body at exactly the same level. Thereby, a reliable electric interconnection to the external apparatuses can be achieved when the semiconductor device is mounted on a printed circuit board and the like.

Other object and further features of the present invention will become apparent from the following detailed description when read in conjunction with the attached drawings.

BRIEF DESCRIPTION OF THE DRAWINGS

FIG. 1 is a perspective view showing a conventional semiconductor device of the QFP type;

FIG. 2 is a perspective view showing a conventional semiconductor device of the PGA type;

FIGS. 3(A) and 3(B) are diagrams respectively showing the semiconductor device according to a first embodiment of a present invention in the side view and a bottom view;

DETAILED DESCRIPTION

Figure 4A:
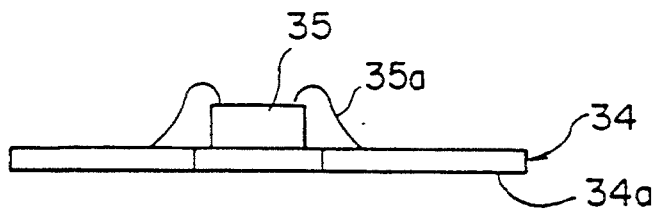
FIGS. 4(A)–4(F) are diagrams showing the process for manufacturing the device of FIGS. 3(A) and 3(B)
Figure 4B:
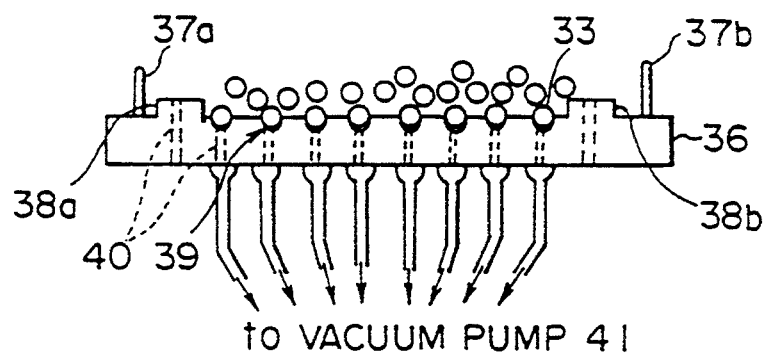

FIGS. 3(A) and 3(B) show a semiconductor device 31 according to a first embodiment of the present invention.

Referring to the drawings, a semiconductor chip 35 (not shown in these drawings, but see FIGS. 4(A)–4(F)) is accommodated in a plastic package body 32, and a number of interconnection leads 33 are provided on the bottom surface of the package body 32 similar to the device of the PGA type. In the present embodiment, the interconnection leads 33 are formed from a number of metal spheres arranged in the row and column formation, and project downwardly from the bottom surface of the package body 32 by a distance of about 30 μm or less. As will be understood from the description below, the magnitude of projection d is extremely uniform throughout the spheres. The deviation is less than 5 μm, usually less than 1 μm.

FIGS. 4(A)–4(F) show the process for manufacturing the device of FIGS. 3(A) and 3(B) according to the first embodiment.

Referring to FIG. 4(A), the semiconductor chip 35 mentioned previously is mounted on a lead frame 34. Further, the bonding pads formed on the semiconductor chip 35 are connected to an inner lead 34a of the lead frame 34 by a bonding wire 35a as usual.

Next, the metal spheres 33 each having the same diameter of 1 mm, for example, are supplied to a jig 36. On the upper major surface of the jig 36, a number of depressions 39 are formed in a row and column formation in correspondence to the intended row and column formation of the spheres 33 on the bottom surface of the package body 32, as shown in FIG. 3(B). In correspondence to each depression 39, a hole 40 is formed to penetrate through the body of the jig 36. Upon supplying of the spheres 33 on the jig 36, some spheres settle in the depressions 39 while other spheres do not settle into the depressions 39. See FIG. 4(B).

Figure 4C:
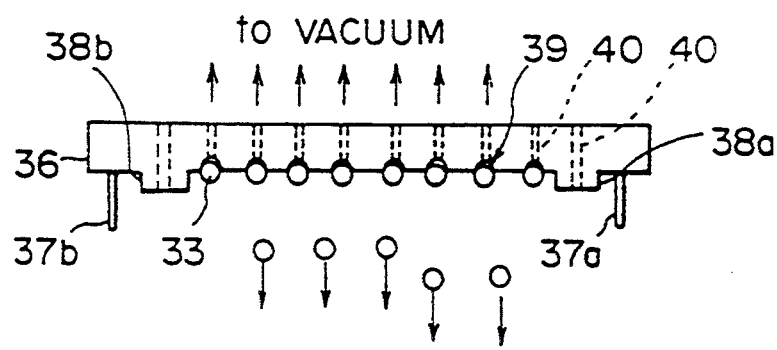
Figure 4D:
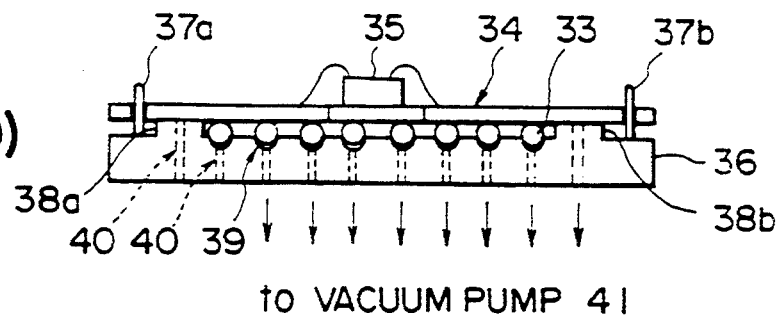
Figure 4E:
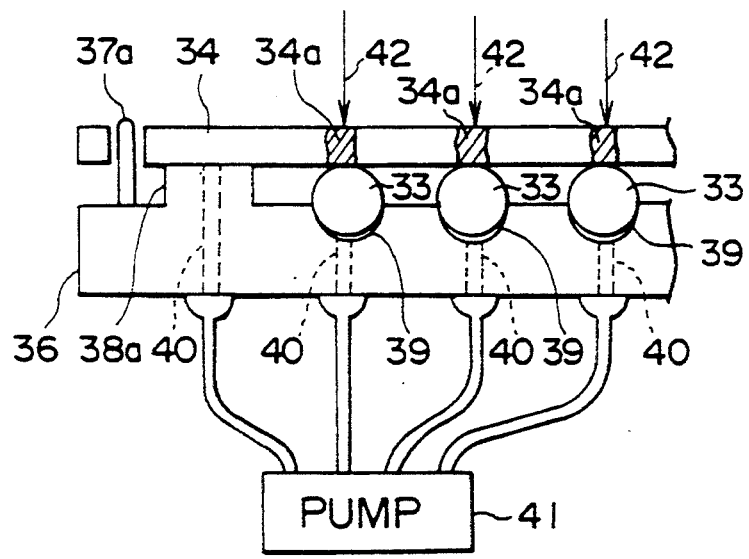

In this state, the vacuum is applied at a rear surface of the jig 36 by a vacuum pump 41 communicating with the holes 40 (see FIGS. 4(C) to 4(E)). Thereby, the spheres 33 that are settled in the depressions 39 are held stably on the jig 36.

Next, the jig 36 is turned over as shown in FIG. 4(C) and the spheres 33 that have failed settle in the depressions 39 fall off from the jig 36.

Next, the foregoing lead frame 34 is placed on the jig 36 as shown in FIG. 4(D). The jig 36 is formed with a support member 38a that extends to surround the region where the depressions 33 is formed, and the lead frame 34 as thus placed is held by the support member 38a. In order to establish a proper positioning in the lateral direction, guide pins 37a and 37b are formed on the jig 36, and the guide pins engage with corresponding openings formed on the lead frame 34 when the lead frame 34 is properly positioned. As will be explained in detail later, the uppermost part of each of the spheres 33 is aligned in a flat plane and contacts the flat lower major surface of the lead frame 34 with precision. It should be noted that these metal spheres can be manufactured with high precision. For example, the JIS (Japanese Industrial Standard) prescribes the allowance of diameter of metal spheres to be less than 5 μm. The lead frame 34 is held stably on the jig 36 by the air pressure that is caused by the vacuum suction applied to the rear side of the jig 36. It should be noted that the penetrating hole 40 is provided also in correspondence to the support member 38a.

Next, a laser beam 42 is irradiated onto the lead frame 34 at parts 34a thereof which correspond to the positions of the respective, underlying spheres 33. Thereby, each corresponding part 34a of the lead frame 34 is caused to melt to form a fused region 34a that fuses with the corresponding metal sphere 33 as shown in FIG. 4(E). In other words, a laser welding of the spheres 33 and the lead frame 34 is established.

Figure 4F:
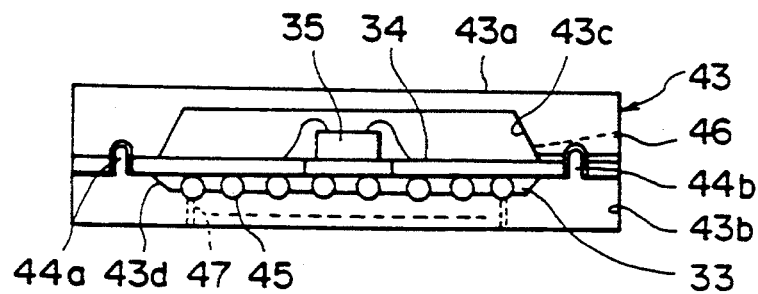

Next, the lead frame 34 is removed from the jig 36 together with the semiconductor chip 35 as well as the metal spheres 33 that are welded to the lead frame 34, and the lead frame 34 is placed on a second jig 43 as shown in FIG. 4(F).

Referring to FIG. 4(F), the jig 43 includes an upper mold 43a and a lower mold 43b, wherein the upper and lower molds are formed with spaces (i.e., recesses, or cavities) 43c and 43d corresponding to the resin package body 32 of the device of FIG. 3(A). On the lower mold 43b, a number of depressions 45 are formed in the row and column formation in correspondence to the row and column formation of the metal spheres on the lead frame 34. Further, each depression 45 is evacuated via a hole 47 penetrating through the lower mold 43b. In order to establish a proper positioning of the mold and the lead frame, guide pins 44a and 44b are provided on the lower mold 43b, and corresponding depressions are provided in the upper mold 43a. The pins 44a and 44b may be provided to engage with the same openings which are formed in the lead frame 34 for accommodating the guide pins 37a and 37b of the jig 36.

When the lead frame 34 is properly mounted on the jig 43 and firmly held thereto by the evacuation through the holes 47, a molten plastic is poured into the combined cavities 43c and 43d in the jig 43 via a passage 46. After curing the plastic, the jig 43 is removed and the packaged semiconductor device of FIGS. 3(A) and 3(B) is obtained.

Figure 5:
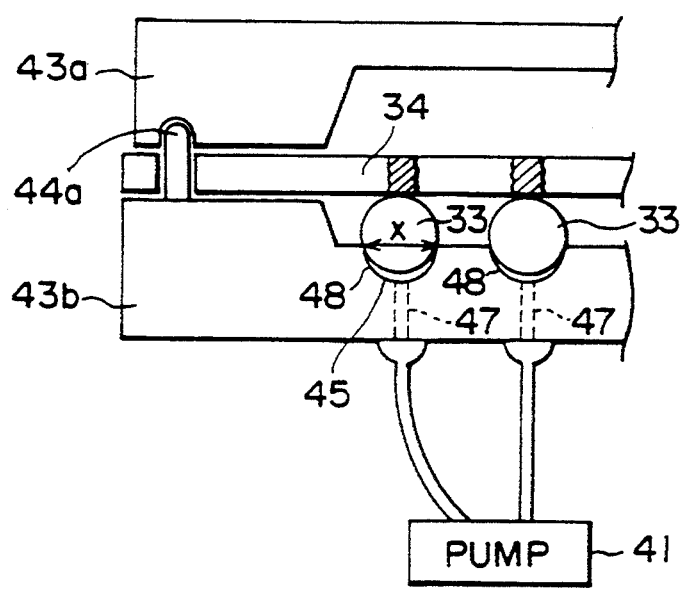
FIG. 5 is a diagram showing the step for establishing the uniform projection of sphere-shaped leads at the bottom surface of the package body for the semiconductor device of FIGS. 3(A) and 3(B)

FIG. 5 shows the process for achieving a uniform projection d of the spherical leads 33 in the semiconductor device 31 as seen in FIG. 3(A). Referring to FIG. 5, the depression 45 has a diameter x that is set smaller than the diameter of the spheres 33. Thereby, a space 48 is formed between the sphere 33 and the mold 43b, and this space 48 is evacuated via the penetrating hole 47. As the metal spheres can be manufactured to have a highly uniform diameter with the tolerance of less than 5 μm, typically less than 1 μm, one can determine the vertical positioning level of the spheres 33 on the mold 43b by setting the diameter x of the circular opening formed at the surface of the mold 43b in correspondence to the semi-spherical depression 45. Typically, the variation of the projection d can be set smaller than a few microns. The space 48 of course produces a negative pressure when evacuated via the hole 47 and thereby the lead frame 34 is firmly held on the mold 43b.

According to the process described above, it will be understood that one can easily arrange the leads in the row and column formation in the package body without shaking and/or human intervention, and the PGA package can be manufactured with reduced cost. Generally, the diameter of the spheres is set to 0.5–2 mm.

Next, a second embodiment of the present invention will be described with reference to FIGS. 6(A)–6(D).

Figure 6A:
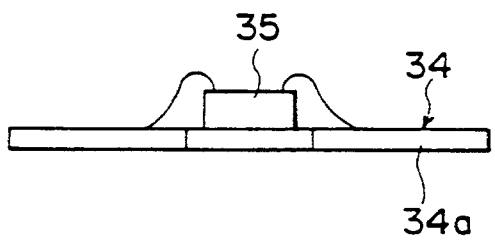
FIGS. 6(A)–6(D) are diagrams showing the process for manufacturing a semiconductor device according to a second embodiment of the present invention.
Figure 6B:
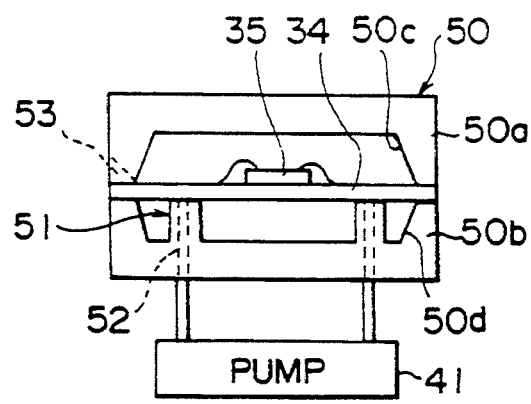
Figure 6C:
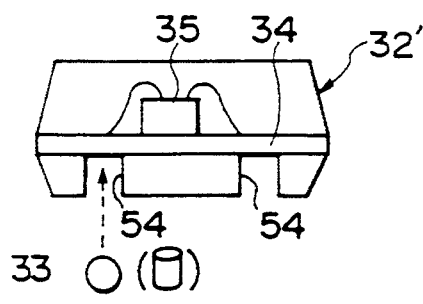
Figure 6D:
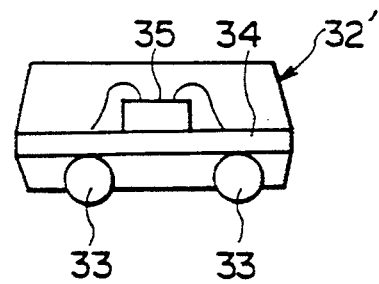

Referring to FIG. 6(A), the semiconductor chip 35 is mounted on the lead frame 34 and electric connection between the chip 35 and the inner lead 34a is established similarly to the first embodiment.

Next, the lead frame 34 is incorporated into a jig 50 that includes an upper mold 50a and a lower mold 50b. Similarly to the jig 43, the upper mold 50a is formed with a space (i.e., recess or cavity) 50c corresponding to the package body 32 of FIG. 3(A). Similarly, the lower mold 50b is formed with a space (i.e., recess or cavity) 50d corresponding to the package body 32 of FIG. 3(B). In the lower mold 50b, there are formed a number of projections 51 in correspondence to the number of spaces, or cavities 50d, such that the projections 51 support the lead frame 34 when the lead frame 34 is mounted on the mold 50b. In each projection 51, a hole 52 is formed and the lead frame 34 is held firmly on the projections 51 when a vacuum is applied to the holes 52 by the pump 41.

It should be noted that the projections 51 are arranged in a row and column formation in correspondence to the row and column arrangement of the spherical leads 33 on the bottom surface of the package body 32 shown in FIG. 3(B). Thus, when a molten plastic is introduced into the spaces 50c and 50d inside the jig 50, the region of the lead frame 34 that is supported by the projections 51 is not covered by the plastic. Thereby, a packaged body 32' having a number of holes (i.e., recesses) 54 at the bottom surface, corresponding to the projections 51, is obtained upon the curing of the plastic. See FIG. 6(C). It should be noted that the holes 54 are arranged in the row and column formation, and the lead frame 34 is exposed through these holes 54.

Next, the package body 32' is turned over and the metal spheres 33 are poured onto the bottom surface, which now is facing upward. After removing the spheres 33 that have failed to settle into the holes 54, the package body 32' is passed through an annealing process. Here, a metal having a low melting point such as solder is used for the sphere 33. At least, the surface of each sphere 33 is coated by such a metal. Thereby, the spheres 33 or at least the surfaces thereof are caused to melt upon annealing and establish a mechanical as well as an electric connection to the lead frame 34. See FIG. 6(D).

According to the present embodiment, the step for using the jig is reduced and the efficiency of production is improved further. Further, the present embodiment can be applicable to the QFP type package. In this case, the projections 51 of the jig 50 are arranged along the lateral edge of the package body 32' to be formed, in conformity with the leads that extend laterally from the package body 32'. In this case, grooves extending laterally are formed in the bottom surface of the package body 32' instead of the holes 54.

Figure 7:
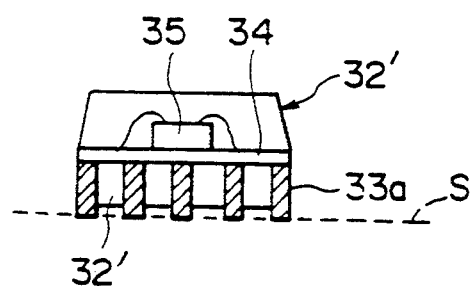
FIG. 7 is a diagram showing a modification of the device of the second embodiment.

By filling the grooves by rod shaped pins 33a shown in FIG. 7, one can obtain a QFP type device wherein the pins extend perpendicularly from the package body 32'. By manufacturing the QFP type device according to the method of the present invention, the vertical level of the pins 33a is aligned exactly on a horizontal plane S, and the problem of the variation in the level of the leads pertinent to the conventional QFP type devices that use the gull-wing type leads, is successfully eliminated.

Figure 8:
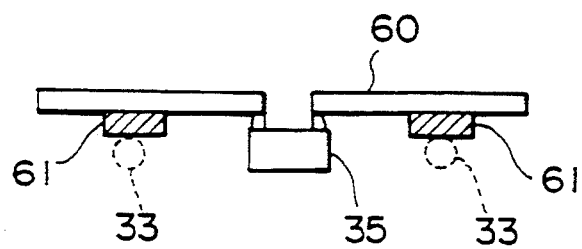
FIGS. 8 and 9 are diagrams showing other embodiments of the present invention.

FIG. 8 shows another embodiment wherein the present invention is applied to the TAB (Tape Automated Bonding) process.

Referring to FIG. 8, the semiconductor chip 35 is mounted on a tape carrier 60 on which a conductor pattern 61 is formed. The spherical lead 33 is connected to this conductor pattern 61 on the carrier 60. In order to hold the spherical leads 33, a jig similar to the jig 36 of the first embodiment is used. As the process is readily derived from the previous description, further description of the present invention will be omitted.

Figure 9:
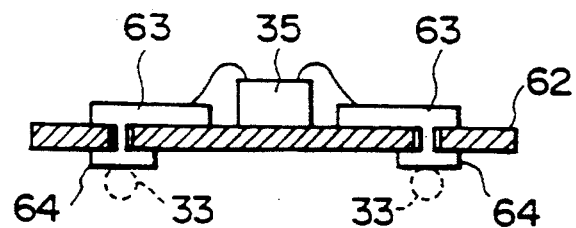

FIG. 9 shows still other embodiment of the present invention, wherein the present invention is applied to the COB (Chip on Board) process.

Referring to FIG. 9, the semiconductor chip 35 is mounted on a board or substrate 62 that carries conductor patterns 63 and 64 respectively on the upper and lower major surfaces of the substrate 62. The upper conductor pattern 63 is connected to the lower conductor pattern 64 via a through hole formed in the substrate 62. The spherical leads 33 are mounted on the lower conductor pattern 63 as illustrated. In this case, too, the spheres 33 are held on the depressions formed in a jig similar to the jig 36. When sealing in the package body, on the other hand, another jig similar to the jig 43 may be used.

It should be noted that the leads used in the present invention are not limited to the spherical leads as described with reference to the first and second embodiments, but any lead may be used as long as it can easily roll on the jig when arranging the leads in a predetermined pattern. The arrangement of the lead is not limited to the row and column formation but any other pattern may be used. Further, the connection of the leads to the lead frame may be made by various welding processes other than the laser beam welding. For example, electric welding may be used in the process of FIG. 4(E).

Further, the present invention is not limited to the embodiments described heretofore, but various variations and modifications may be made without departing from the scope of the invention.

What is claimed is:

1. A method for manufacturing a semiconductor device having a resin package, comprising the steps of:

supplying a plurality of terminal members, each terminal member having a geometric form permitting substantially free rolling movement thereof when placed on a flat surface, on a jig that has an upper major surface, said upper major surface being formed with a plurality of depressions arranged in accordance with a desired lead pattern, such that the terminal members settle in the depressions and are held thereby, said depressions being smaller than the terminal members such that a space is formed between the terminal members and the depressions when the terminal members are held in the depressions;

placing an interconnection member on said jig, the interconnection member having upper and lower major surfaces and carrying a semiconductor chip on one of the upper and lower major surfaces, said interconnection member further having a conductor pattern in electrical connection with the semiconductor chip, such that the lower major surface of the interconnection member establishes contact with the terminal members held in the depressions;

establishing an electric connection and a mechanical connection between the terminal members held in the depressions and the interconnection member; and casting a resin on the interconnection member thereby to form the resin package and such that the semiconductor chip and the interconnection member are embedded in the resin package with the terminal members projecting from the package.

2. A method as claimed in claim 1 in which each depression of the jig is evacuated through a corresponding passage formed in the jig so as to communicate with the depression.

3. A method as claimed in claim 2 in which said step of casting a resin comprises the steps of:

placing the interconnection member, to which the terminal members are connected electrically and mechanically in the step of establishing the electric connection and the mechanical connection, on a second jig that has a corresponding, second upper major surface, said second upper major surface of the second jig having a plurality of depressions arranged therein in accordance with the terminal members connected to the interconnection member and such that the terminal members are settled in the depressions, said depressions being smaller than the terminal members such that a space is formed between the terminal members and the depressions when the interconnection member is placed on the second jig; and pouring a resin onto, and thereby to bury, the interconnection member together with the semiconductor chip held thereon.

4. A method as claimed in claim 1 in which said step of establishing the electric connection and the mechanical connection comprises welding the terminal members to the interconnection member.

5. A method for manufacturing a semiconductor device having a resin package, comprising the steps of:

placing an interconnection member on a jig, the interconnection member having upper and lower major surfaces and carrying a semiconductor chip on one of the upper and lower major surfaces thereof, said interconnection member further having a conductor pattern in electrical connection with the semiconductor chip, the jig further having a plurality of support members projecting therefrom and contacting corresponding positions on the interconnection member when the interconnection member is placed on the jig, said plurality of support members being arranged in a pattern corresponding to the conductor pattern of the interconnection member;

casting a resin on the interconnection member in the state in which the interconnection member is placed on the jig and so as to form a resin package in which the semiconductor chip and the interconnection member are embedded;

removing the jig from the resin package, said resin package having a plurality of depressions therein corresponding to the positions at which the support members of the jig contacted the interconnection member;

supplying a plurality of terminal members, each terminal member having a geometric form permitting substantially free rolling movement thereof when placed on a flat surface, to the resin package such that respective said terminal members settle in the plurality of depressions; and fusing the respective terminal members, as settled in the plurality of depressions, to the interconnection member.

6. A method as claimed in claim 5 in which said step of fusing comprises annealing the resin package.

* * * * *

UNITED STATES PATENT AND TRADEMARK OFFICE
CERTIFICATE OF CORRECTION

PATENT NO. : 5,403,776
DATED : April 4, 1995
INVENTOR(S) : TSUJI et al.

It is certified that error appears in the above-indentified patent and that said Letters Patent is hereby corrected as shown below:

Col. 3, line 37, change "settle" to --to settle--;
line 42, change "where" to --in which--; and change "is" to --are--.

Signed and Sealed this

Thirty-first Day of October 1995

Attest:

BRUCE LEHMAN

*Attesting Officer*     *Commissioner of Patents and Trademarks*